(12) United States Patent
Jasberg et al.

(10) Patent No.: US 7,642,817 B2
(45) Date of Patent: Jan. 5, 2010

(54) DRIVER CIRCUIT FOR A SEMICONDUCTOR POWER SWITCHING ELEMENT

(75) Inventors: Hartmut Jasberg, Ottobrunn (DE); Bernhard Strzalkowski, Munich (DE)

(73) Assignee: Infineon Technologies Austria AG, Villach (AT)

( * ) Notice: Subject to any disclaimer, the term of this patent is extended or adjusted under 35 U.S.C. 154(b) by 181 days.

(21) Appl. No.: 11/833,992

(22) Filed: Aug. 4, 2007

(65) Prior Publication Data

US 2008/0030257 A1   Feb. 7, 2008

(30) Foreign Application Priority Data

Aug. 4, 2006   (DE) ........................ 10 2006 036 569

(51) Int. Cl.
*H03K 3/00* (2006.01)
(52) U.S. Cl. .................................. 327/108; 327/375
(58) Field of Classification Search ................. 327/108, 327/109, 110, 112, 375, 379–383
See application file for complete search history.

(56) References Cited

U.S. PATENT DOCUMENTS

| | | | |
|---|---|---|---|
| 5,943,205 A | 8/1999 | Erckert et al. | |
| 6,335,646 B1 * | 1/2002 | Nagatomo | 327/143 |
| 6,570,416 B1 * | 5/2003 | Isurin et al. | 327/109 |
| 6,724,175 B1 * | 4/2004 | Matsuda et al. | 323/283 |
| 6,859,087 B2 * | 2/2005 | Galli et al. | 327/423 |
| 2004/0251951 A1 * | 12/2004 | Beck | 327/427 |

FOREIGN PATENT DOCUMENTS

| | | |
|---|---|---|
| DE | 19702602 C1 | 8/1998 |
| DE | 10101074 A1 | 8/2002 |
| DE | 10217575 A1 | 11/2003 |

OTHER PUBLICATIONS

Office Action from German patent office for priority German application 10 2006 036 569.0, dated Mar. 26, 2007.
Data Sheet for TD350 Advanced IGBT/MOSFET Driver, STMicroelectronics, pp. 1-11, Aug. 2004.

* cited by examiner

*Primary Examiner*—Lincoln Donovan
*Assistant Examiner*—Thomas J Hiltunen
(74) *Attorney, Agent, or Firm*—Banner & Witcoff, Ltd.

(57) ABSTRACT

An apparatus and method for driving a semiconductor switching element. The apparatus is configured to monitor at least one state variable of the semiconductor switching element, to switch off the semiconductor switching element in at least two stages, and to receive both a first parameter and a second parameter, the first and second parameters affecting how the state is monitored. The apparatus is further configured to receive both a third parameter and a fourth parameter, the third and fourth parameters affecting a two-stage switching-off operation of the semiconductor switching element.

13 Claims, 4 Drawing Sheets

DRIVER CIRCUIT FOR A SEMICONDUCTOR POWER SWITCHING ELEMENT

CROSS-REFERENCE TO RELATED APPLICATIONS

This application claims priority to German Patent Application No. 10 2006 036 569.0, filed Aug. 4, 2006, hereby incorporated by reference herein as to its entirety.

BACKGROUND

An insulated gate bipolar transistor (IGBT) is a type of semiconductor power switching element that has been used to an increasing extent for a relatively long time in power electronics, since it combines features of a bipolar transistor (good on-state behavior, high reverse voltage) and features of a field-effect transistor (FET) (virtually power-free driving). A certain amount of robustness to short circuits is also obtained, since the IGBT limits load current. IGBT power switches are often used in the high-power range since they typically have a high reverse voltage of, for example, 6.6 kV, and may switch high currents, for example up to 3 kA.

An IGBT power switch typically involves intelligent driving and reliable operating point monitoring to realize the full performance potential and to simultaneously ensure reliable switching operation. The driver circuit for driving the IGBT should be able to switch the IGBT on and off without destruction in each operating state defined in a data sheet, for example, destruction being possible during a bridge or load short circuit.

It is generally known that an IGBT can be protected from states which are dangerous for the IGBT, for example an overcurrent or short circuit, using desaturation monitoring and a two-stage switching-off operation.

In this case, the collector-emitter voltage $V_{ce}$, which is an indicator of overloading, is measured during the switching-on phase of the IGBT. If an overcurrent occurs, the collector-emitter voltage $V_{ce}$ rises above a value $V_{cesat}$ which is known, for example, from a data sheet for the IGBT. The rise can be detected by a comparator. However, due to varying switching-on inertia of different IGBTs, the comparator is not activated until after a particular interval of time, i.e., there is a delay between the switching-on moment of the IGBT and the activation of the comparator.

In order to be able to use a driver circuit for desaturation monitoring for a plurality of different types of IGBTs, the delay and the voltage threshold of the collector-emitter voltage $V_{ce}$ are set separately from one another in order to make optimum use of the respective type of IGBT.

However, this means that setting the delay and the collector-emitter voltage $V_{ce}$ independently of one another would involve using two pins of a package at which the parameters can be set independently of one another with the aid of external voltages and corresponding components. These additional two pins are not readily available in modern standardized 16-pin IC packages if yet further monitoring functions which can be set are intended to be implemented in the driver circuit. Even if packages having a sufficiently large number of free pins are available, the manner in which the delay and collector-emitter voltage are set results in an increase in the complexity and costs of the IGBT.

Furthermore, desaturation monitoring is already used in bipolar power transistors in order to protect against an overcurrent and/or short-circuit current, but a plurality of drive modules are also used.

In addition, it is advisable to switch off the IGBT in a "soft" manner as it were, that is to say in a plurality of stages, since, in the event of overloading or a short circuit, the IGBT may be destroyed by the production of a large collector-emitter overvoltage during the rapid switching-off operation. The operation of switching off an IGBT or a metal-oxide-semiconductor FET (MOSFET) in a plurality of stages is known from more modern drivers, for example the TD350 driver marketed by STMicroeletronics.

In this case, the voltage threshold of a first switching-off stage and an interval of time, in which the voltage threshold is kept at a particular voltage level, are used to switch off the IGBT in a "soft" manner, the values for the voltage threshold and the corresponding interval of time, in which the voltage threshold is kept constant, depending to a very significant extent on the design of the power inverter and varying for different types of IGBTs.

In this case, the voltage threshold and the interval of time are usually also set using two separate pins, which is again associated with increased complexity and higher costs since the standardized 16-pin IC packages cannot be readily used.

SUMMARY

Illustrative aspects as described herein are directed to an apparatus for driving a semiconductor switching element. The apparatus is configured to monitor at least one state variable of the semiconductor switching element, to switch off the semiconductor switching element in at least two stages, and to receive both a first parameter and a second parameter, the first and second parameters affecting how the state is monitored. The apparatus is further configured to receive both a third parameter and a fourth parameter, the third and fourth parameters affecting a two-stage switching-off operation of the semiconductor switching element.

Further illustrative aspects are directed to methods performed by the apparatus.

These and other aspects of the disclosure will be apparent upon consideration of the following detailed description.

BRIEF DESCRIPTION OF THE DRAWINGS

A more complete understanding of the present disclosure may be acquired by referring to the following description in consideration of the accompanying drawings, in which like reference numbers indicate like features, and wherein.

DETAILED DESCRIPTION

Figure 1:
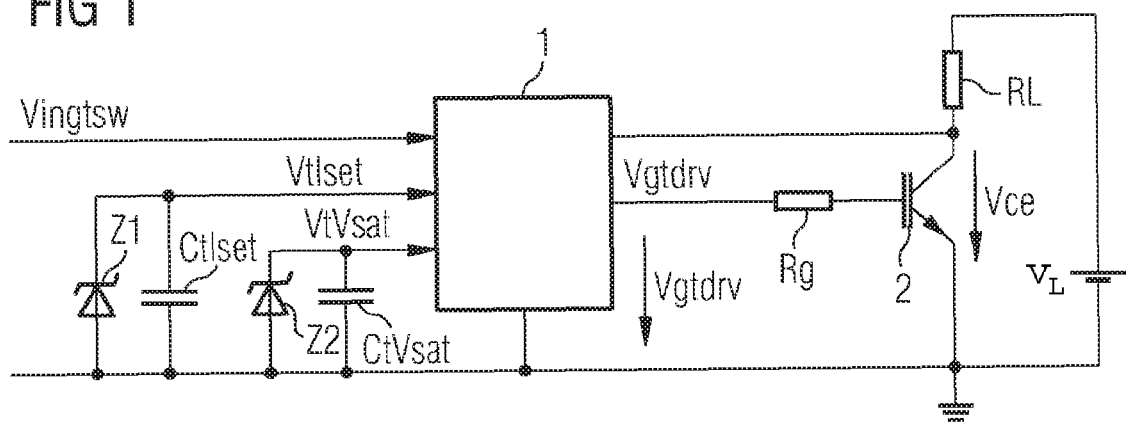
FIG. 1 is a schematic diagram of an illustrative embodiment of a driver circuit having capacitors and zener diodes for setting the voltage thresholds and intervals of time.

The aspects summarized previously, as well as other aspects, may be embodied in various forms. The following description shows by way of illustration various examples in which the aspects may be practiced. It is understood that other examples may be utilized, and that structural and functional modifications may be made, without departing from the scope of the present disclosure.

Except where explicitly stated otherwise, all references herein to two or more elements being "coupled," "connected," and "interconnected" to each other is intended to broadly include both (a) the elements being directly connected to each other, or otherwise in direct communication with each other, without any intervening elements, as well as (b) the elements being indirectly connected to each other, or otherwise in indirect communication with each other, with one or more intervening elements.

Various aspects described herein may potentially attain an advantage of developing a generic driver circuit for settable desaturation monitoring and a settable operation of switching off a semiconductor power switching element in at least two stages to the effect that the connection complexity for the monitoring component of the driver circuit may be reduced and, in particular, the semiconductor circuit and the driver circuit may be accommodated together in a single chip package such as a standardized 16-pin integrated circuit (IC) package.

In some embodiments, two parameters may be used to monitor the state of the IGBT or another type of switch, and two parameters may be used to switch off the IGBT (or other type of switch) in two stages. These parameters may be set independently of one another using, for instance, only one pin of the IC for each parameter pair. This may allow the driver circuit to be integrated together with the IGBT (or other type of switch) in a single chip package, such as an industry-approved standard 16-pin IC package.

In further embodiments, the state to be monitored may be the degree of desaturation of the semiconductor device. Monitoring the degree of desaturation may allow for quick detection of an overcurrent or short-circuit current, which may be dangerous for the semiconductor device, thus potentially making it possible to prevent destruction of a semiconductor device such as an IGBT. Furthermore, the first and second parameters, and the third and fourth parameters, may be respectively set independently of one another. This may make it possible to set the driver circuit in an extremely flexible manner for different types of semiconductors.

For example, the first parameter may be a first voltage threshold for desaturation monitoring, and the second parameter may be a first interval of time between a switching-on time of the semiconductor power switching element and the activation of a comparator which compares the first voltage threshold with a reference voltage. This may result in the desaturation of the IGBT being detected in a simple manner and at the optimum time.

Furthermore in this example, the third parameter may be a second voltage threshold for a first switching-off stage of the semiconductor device, and the fourth parameter may be a second interval of time for the duration of the second voltage threshold. A soft switching-off operation using an intermediate voltage threshold may reduce the possibility of, or even prevent, the semiconductor power switching element from being switched off too rapidly and thus possibly being destroyed.

Moreover, in some embodiments, the first and second voltage thresholds may be set using a first zener diode and a second zener diode, respectively. In other embodiments, the first and second voltage thresholds may be additionally or alternatively set using first and a second resistors, respectively.

Furthermore, the first and second intervals of time may be set using first and second capacitors, respectively, the setting being effected in accordance with the principle of capacitor charging or capacitor discharging. This may make it possible to use capacitors to adapt the intervals of time in a simple manner independently of one another and in accordance with the requirements of the particular IGBT.

An illustrative embodiment of a circuit is shown schematically in FIG. 1. The circuit in this example includes a driver circuit 1 for an IGBT 2 and peripheral components which are coupled to the driver circuit. In this case, a zener diode Z1 which is connected in parallel with a capacitor CtIset and a zener diode Z2 which is connected in parallel with a capacitor CtVsat are each coupled to an input of the driver circuit 1. Furthermore, the gate of the IGBT 2 is connected to an output of the driver circuit 1 via an upstream resistor Rg, and the collector of the IGBT 2 is connected to an input of the driver circuit 1 and, via a load resistor $R_L$, to a voltage source $V_L$.

The driver circuit 1 of FIG. 1, together with peripheral components, may make it possible in the case of a two-stage switching-off operation to set a voltage threshold $V_{tIset}$ using the zener diode Z1 and to set a corresponding interval of time tIset using the capacitor $C_{tIset}$, the interval of time tIset respectively being set in accordance with the principle of capacitor charging or capacitor discharging with a constant current for the circuit in FIG. 1. In this example:

$$tIset=(C_{tIset}*V_{tIset})/I_{ref1}$$

$I_{ref1}$ is a reference current of the driver circuit. In addition, it may be possible to monitor the desaturation of the IGBT 2 by setting the voltage threshold $V_{tVsat}$ using the zener diode Z2 and setting the corresponding interval of time $t_{Vsat}$ for the delay using the capacitor $C_{tVsat}$. In this case, $V_{cc}$ represents the collector-emitter voltage, $V_{gtdrv}$ represents the gate driver voltage for the IGBT, and $V_{ingtsw}$ represents the voltage of an input signal.

Figure 2:
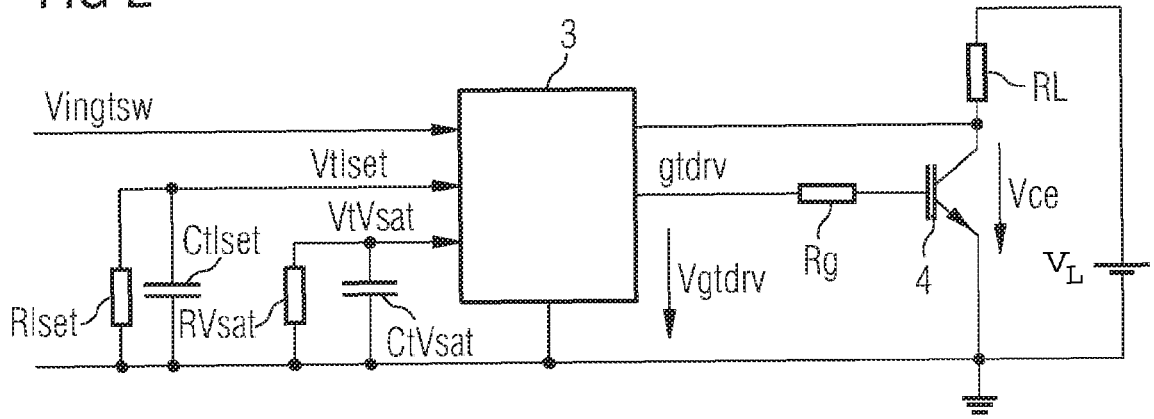
FIG. 2 is a schematic diagram of an illustrative embodiment of a driver circuit having capacitors and resistors for setting the voltage thresholds and intervals of time.

Instead of the zener diodes Z1 and Z2 illustrated in FIG. 1, a driver circuit 3 in FIG. 2 may use corresponding resistors $R_{Iset}$ and $R_{Vsat}$ for setting the voltage thresholds, represented by the products $[R_{Iset}*I_{ref1}]$ and $[R_{Vsat}*I_{ref2}]$.

The circuit includes a driver circuit 3 for an IGBT 4 and peripheral components which are coupled to the driver circuit. In this case, a resistor $R_{Iset}$ which is connected in parallel with a capacitor CtIset and a resistor $R_{Vsat}$ which is connected in parallel with a capacitor CtVsat are each coupled to an input of the driver circuit 3. Furthermore, the gate of the IGBT 4 is connected to an output of the driver circuit via an upstream resistor Rg, and the collector of the IGBT 4 is connected to an input of the driver circuit 3 and, via a load resistor $R_L$, to a voltage source $V_L$.

Figure 3:
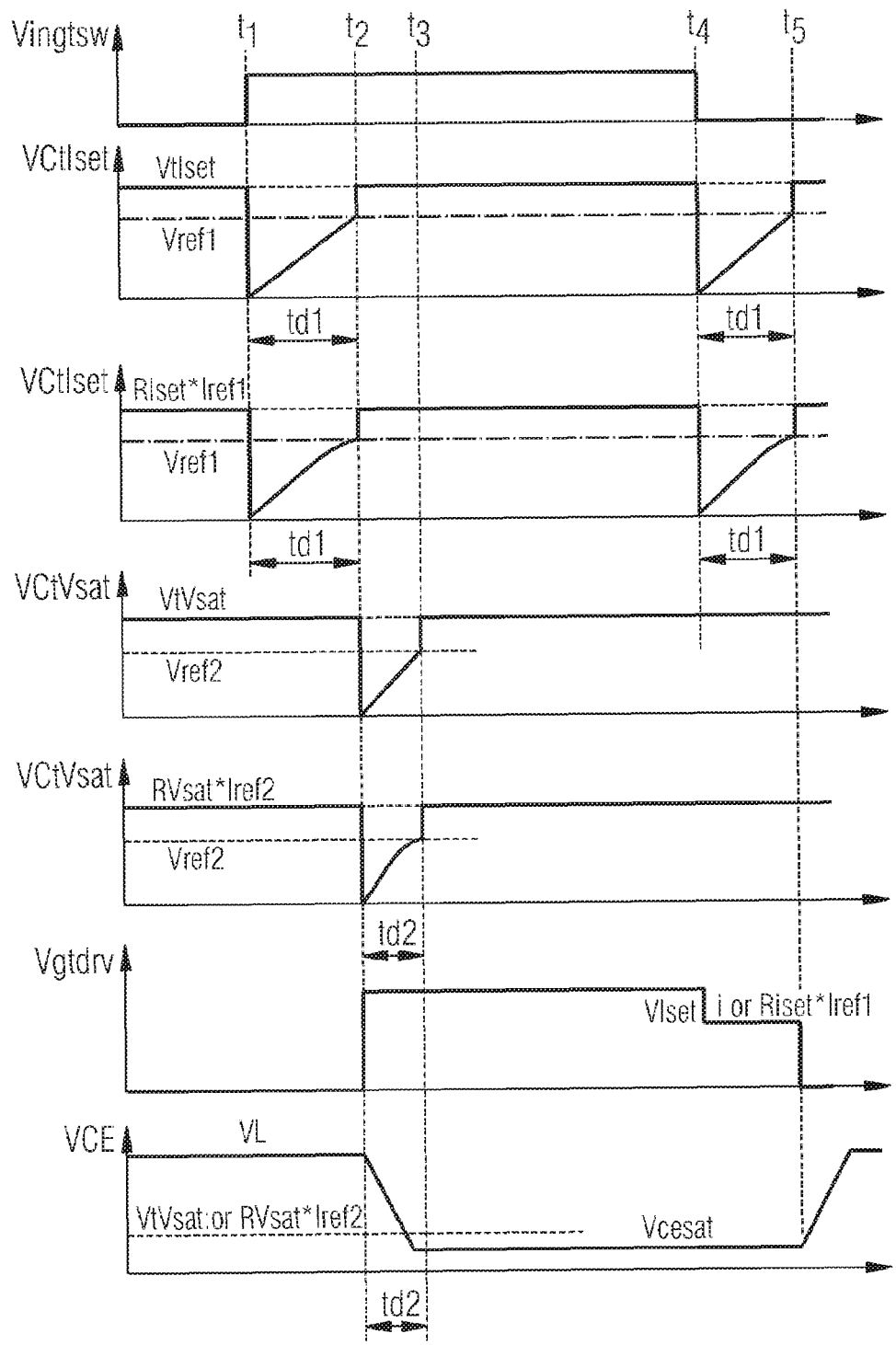
FIG. 3 is a series of illustrative voltage/time diagrams for various voltages and intervals of time for the driver circuits shown in FIGS. 1 and 2, the principle of capacitor charging being used.
Figure 4:
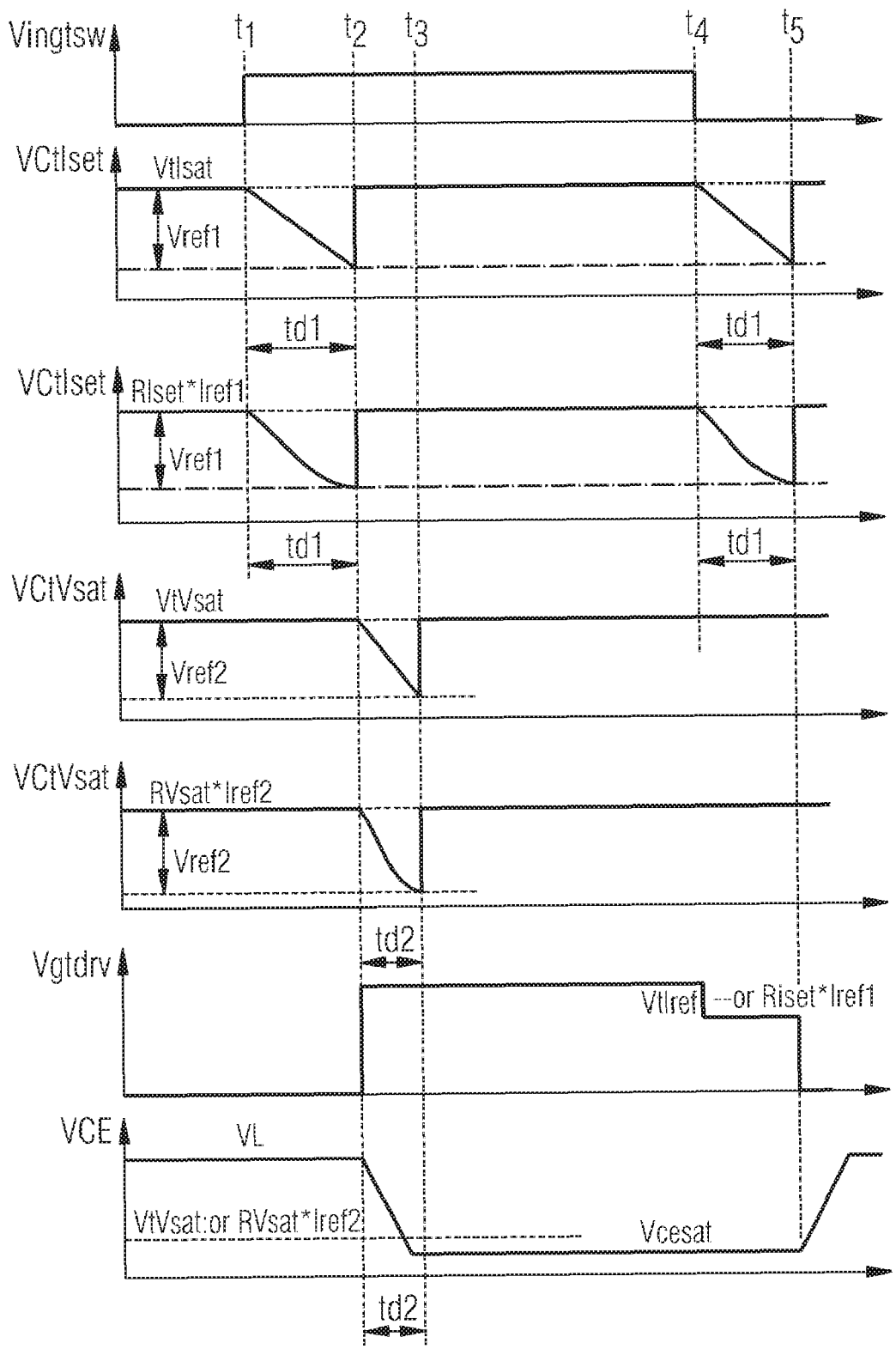
FIG. 4 is a series of illustrative voltage/time diagrams for various voltages and intervals of time for the driver circuits shown in FIGS. 1 and 2, the principle of capacitor discharging being used.

The illustrative voltage/time diagrams of FIGS. 3 and 4 show that, for the circuit from FIG. 2 for example, the capacitor voltage $V_{CtIset}$ (t) increases in a "quasi-linear" manner when the principle of capacitor charging is used, and the capacitor voltage $V_{ctIset}$ (t) decreases in a "quasi-linear" manner when the principle of capacitor discharging is used. In this case, it is assumed that the current value is "quasi-constant" in particular ranges. The following is then true for the capacitor voltage $V_{CtIset}$ (t):

$$V_{CtIset}(t)=I_{ref1}*R_{Iset}*(1-C_{tIset}*R_{Iset}/(C_{tIset}*R_{Iset}+t))$$

In this case, at times t1 and t4, the capacitor $C_{tIset}$ is discharged very quickly using a current source I3 (FIG. 5) or a short circuit. The charging phase with the constant current (for the driver circuit in FIG. 1) or "quasi-constant" current (for the driver circuit in FIG. 2) starts immediately afterward.

The charging phase lasts until time t2 or t5 when the capacitor voltage $V_{cIset}$ (t) reaches the value of the internal reference voltage $V_{ref1}$.

After time t2 or t5 has been reached, a new current source I2 (FIG. 5) is connected for a short time in order to bring the capacitor $C_{tIset}$ to the value of the desired voltage threshold, $V_{tIset}$ or $[R_{Iset}*I_{ref1}]$, in a very rapid manner. The voltage threshold, $V_{tIset}$ or $[R_{Iset}*I_{ref1}]$, is determined in this case by the zener voltage $U_{Z1}$ of the zener diode Z1 or the value of the product $[R_{Iset}*I_{ref1}]$.

The signal delay mechanism using an interval of time, for example $t_{d1}$ (t5-t4), may also be used in this example for the switching-on operation (t2-t1) to provide signal fidelity between the input signal $V_{ingtsw}$ and the gate driver signal $V_{gtdrv}$ of the driver circuit.

In this case, the interval of time td2 (t3-t2) and the voltage threshold $V_{tVsat}$ or $[I_{ref2}*R_{Vsat}]$ may be set in a manner analogous to the operation ($t_{d1}$, $V_{tIset}$) described above. However, one difference may be that the discharging phase of the capacitor $C_{tVsat}$ begins at time t2. At time t2, the $C_{tVsat}$ is discharged very quickly using a current source I5 (FIG. 5) or a short circuit. The charging phase with a constant current or quasi-constant current (FIG. 2) starts immediately afterward. The phase lasts until the time t3 when the capacitor voltage reaches the value of the internal reference $V_{ref2}$. A new current source I5 (FIG. 5) is then connected in order to bring the capacitor to the value of the desired threshold voltage in a very rapid manner. The threshold voltage is then determined by the zener diode Z2 (FIG. 1) or by the value of the product $I_{ref2}*R_{Vsat}$. After the interval of time $t_{d2}$ has elapsed, desaturation monitoring using a comparator K3 (FIG. 5) is then activated with the voltage threshold $V_{tVsat}$ or $[I_{ref2}*R_{Vsat}]$ which has been set.

Figure 5:
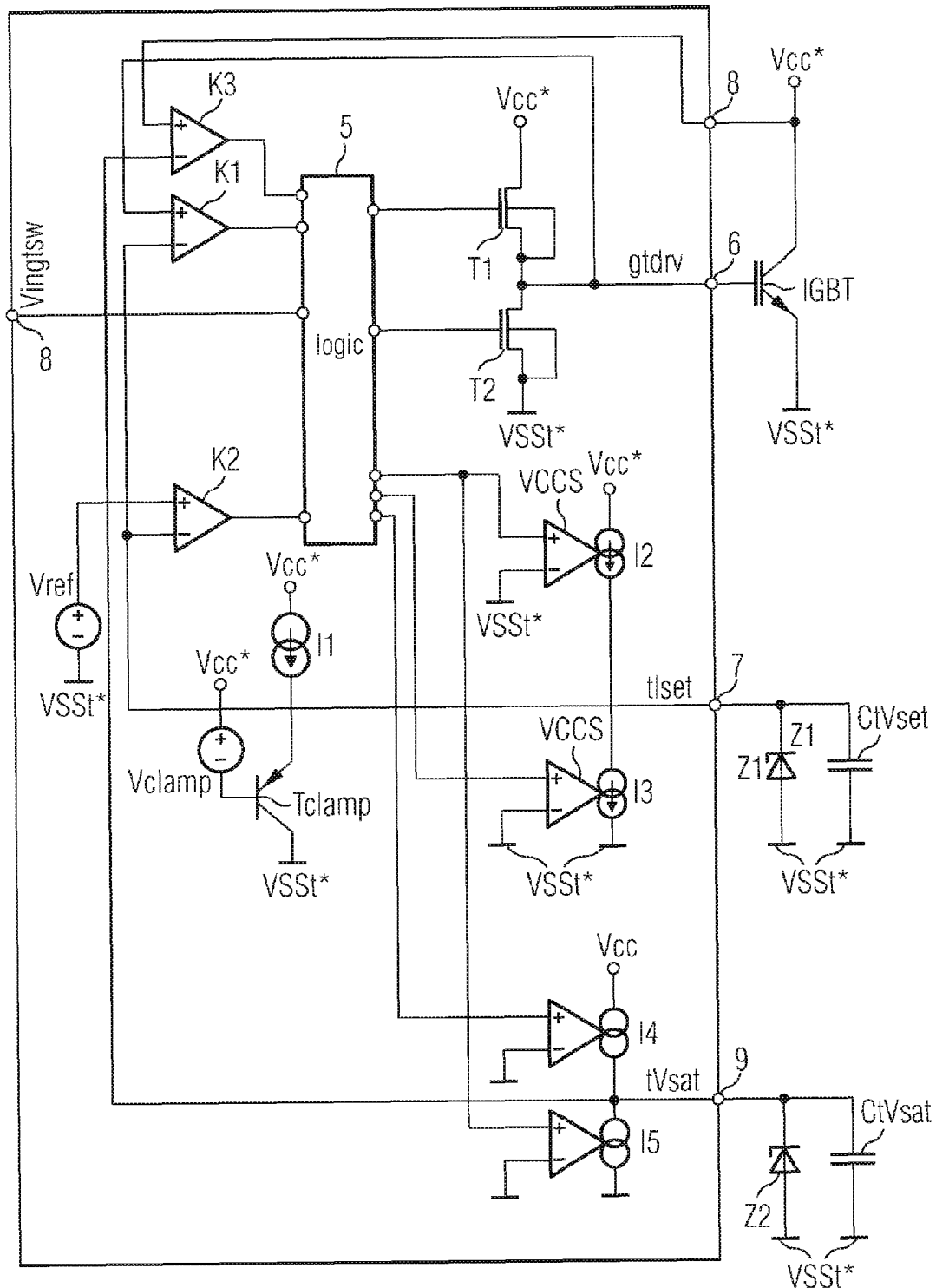
FIG. 5 is a schematic diagram of an illustrative embodiment of the driver circuit for explaining the operation of switching off the IGBT in two stages.

FIG. 5 shows a circuit diagram of an illustrative embodiment of the driver circuit 1 and is used to describe an illustrative embodiment of the operation of switching off an IGBT in two stages.

In this example, the driver circuit 1 includes a central logic element 5 which controls two transistors T1 and T2 which are connected to a pin 6. In addition, the logic element 5 controls two current sources I2 and I3 which are connected to a pin 7. A pin 8 is directly connected to an input of the logic element 5 and is also connected to a first input of the comparator K3. Pin 6 is also connected to a first input of a comparator K1 and pin 7 is connected to a second input of a comparator K1, the output of the comparator K1 being coupled to the logic element 5.

A second input of a comparator K2 is connected to the second input of the comparator K1 and accordingly to the pin 7, the first input of the comparator K2 being coupled to a reference voltage source $V_{ref}$. The connection between the two second inputs of the comparators K1 and K2 and the pin 7 is also coupled to a clamping voltage $V_{clamp}$ via a clamping transistor $T_{clamp}$.

Pin 9 is connected to the second input of the comparator K3 and is also coupled to corresponding current sources I4, I5.

The input signal $V_{ingtsw}$ illustrated in FIG. 5 initiates the operation of switching the IGBT on and off. In this case, there are six operating states which are considered and described separately.

(a) Delayed Switching-Off

The IGBT is switched off when the input signal $V_{ingtsw}$ changes from the high state to the low state. The output driver transistor T1 is switched off and the transistor T2 is simultaneously switched on. The transistor T2 thus discharges the gate of the IGBT. The comparator K1 compares the voltages at the pin "gtdrv" and at the pin "tIset". If the voltage $V_{gtdrv}$ falls below the value of $V_{tIset}$, the transistor T2 is switched off.

The output driver is now in a tri-state mode. The potential $V_{gtdrv}$ thus remains virtually constant, a discharging current I3 simultaneously being switched on. The discharging current I3 abruptly discharges the external capacitor $C_{tIset}$ at the pin "tIset". After a delay, such as 500 ns, the discharging current I3 is switched off and the current source I1 then slowly charges the external capacitor $C_{tIset}$ again.

In addition, the comparator K2 compares the voltage $V_{tIset}$ at the pin "tIset" with an internal reference voltage $V_{ref}$. If $V_{tIset}$ reaches the value of the internal reference voltage $V_{ref}$, the transistor T2 is switched on again and the gate of the IGBT continues to be discharged. At the same time, a charging current I2 is switched on, the charging current abruptly charging the capacitor $C_{tIset}$. The charging current I2 is switched off again after a delay such as 500 ns, the current source I1 now providing the holding current for the zener diode Z1.

(b) Delayed Switching-On

If $V_{ingtsw}$ changes from the "low" state to the "high" state, the IGBT is switched on after a delay time has elapsed. In this case, the delay time is equal to the switching-off time which results from the, for example, 500 ns for discharging the capacitor $C_{tIset}$ and the charging time of the capacitor $C_{tIset}$ before the internal reference voltage $V_{ref}$ is reached.

(c) Brief Switching-On

If, for example, $V_{ingtsw}$ again provides a switching-off command after the switching-on operation and before the switching-on delay time has elapsed, the switching-on process is carried out in full before the switching-off operation is initiated.

(d) Brief Switching-Off

If a switching-on command is given after the $V_{ingtsw}$ switching-off command and before the switching-off delay time has elapsed, the logic device "logic" aborts the "tri-state mode" and restarts the delay time, the IGBT being switched on only after the delay time has elapsed.

(e) $V_{cc} < V_{tIset}$

The zener diode voltage $V_{tIset}$ is defined using an internal current source and an external zener diode Z1. If the supply voltage $V_{cc}$ of the IC falls below the zener diode voltage, the IGBT should not switch on in an undefined manner. In this case, an internal clamping circuit ($V_{clamp}$, $T_{clamp}$) bridges the external zener diode Z1 and generates an internal reference voltage, which is below the supply voltage $V_{cc}$, for $V_{tIset}$.

(f) Deactivated Switching-On and Switching-Off Delay

The tri-state mode switching-off operation and the switching-on delay of the IGBT may be deactivated by connecting the pin "tIset" to ground potential "VSS".

The invention claimed is:

1. An apparatus for driving a semiconductor switching element, comprising:
    a first electrical node configured to be coupled to a gate of the semiconductor switching element;
    a second electrical node configured to be coupled to a collector of the semiconductor switching element;
    a third electrical node;
    a fourth electrical node;
    a first comparator having a first input coupled to the second electrical node and a second input coupled to the third electrical node;
    a second comparator having a first input coupled to the first electrical node and a second input coupled to the fourth electrical node;
    a first zener diode coupled to the third electrical node;
    a second zener diode coupled to the fourth electrical node;

a first capacitor coupled to the third electrical node and in parallel with the first zener diode; and a second capacitor coupled to the fourth electrical node and in parallel with the second zener diode, wherein the apparatus is configured to monitor at least one state variable of the semiconductor switching element, to switch off the semiconductor switching element in at least two stages, and to set at the third electrical node both a first parameter and a second parameter, the first and second parameters affecting how the state is monitored, the apparatus being further configured to set at the fourth electrical node both a third parameter and a fourth parameter, the third and fourth parameters affecting a two-stage switching-off operation of the semiconductor switching element.

2. The apparatus of claim 1, further comprising a chip package having a plurality of pins, wherein the first, second, third, and fourth electrical nodes are a first, second, third, and fourth one of the pins, respectively.

3. The apparatus of claim 1, wherein the state variable is a degree of desaturation of the semiconductor switching element.

4. The apparatus of claim 1, wherein the state variable is a degree to which the semiconductor switching element has been switched off.

5. The apparatus of claim 1, wherein first and second parameters together may be set independently of the third and fourth parameters together.

6. The apparatus of claim 1, wherein the third parameter is a first voltage threshold for the two-stage switching-off operation and the fourth parameter is a first interval of time for a duration of the first voltage threshold.

7. The apparatus of claim 1, further comprising:
a first resistor coupled to the third electrical node; and
a second resistor coupled to the fourth electrical node.

8. The apparatus of claim 7, further comprising the semiconductor switching element.

9. The apparatus of claim 8, wherein the semiconductor switching element is an insulated gate bipolar transistor.

10. An apparatus for driving a semiconductor switching element, comprising:
a first electrical node configured to be coupled to a gate of the semiconductor switching element;
a second electrical node configured to be coupled to a collector of the semiconductor switching element;
a third electrical node;
a fourth electrical node;
a first comparator having a first input coupled to the second electrical node and a second input coupled to the third electrical node;
a second comparator having a first input coupled to the first electrical node and a second input coupled to the fourth electrical node;
a first resistor coupled to the third electrical node; and
a second resistor coupled to the fourth electrical node;
a first capacitor coupled to the third electrical node and in parallel with the first resistor; and
a second capacitor coupled to the fourth electrical node and in parallel with the second resistor,
wherein the apparatus is configured to monitor at least one state variable of the semiconductor switching element, to switch off the semiconductor switching element in at least two stages, and to set at the third electrical node both a first parameter and a second parameter, the first and second parameters affecting how the state is monitored, the apparatus being further configured to set at the fourth electrical node both a third parameter and a fourth parameter, the third and fourth parameters affecting a two-stage switching-off operation of the semiconductor switching element.

11. An apparatus, comprising:
a chip package comprising a first pin, a second pin, a third pin, and a fourth pin;
a first comparator having a first input coupled to the first pin and a second input coupled to the second pin;
a second comparator having a first input coupled to the third pin and a second input coupled to the fourth pin;
a first transistor configured to switchably couple the third pin to a first fixed potential;
a second transistor in series with the first transistor and configured to switchably couple the third pin to a second fixed potential;
a first capacitor coupled to the second pin;
a second capacitor coupled to the fourth pin;
a first zener diode coupled to the second pin in parallel with the first capacitor; and
a second zener diode coupled to the fourth pin in parallel with the second capacitor.

12. The apparatus of claim 11, further comprising a semiconductor switching element having a gate coupled to the third pin and a collector coupled to the first pin.

13. The apparatus of claim 11, further comprising:
a first resistor coupled to the second pin in parallel with the first capacitor; and
a second resistor coupled to the fourth pin in parallel with the second capacitor.

* * * * *